United States Patent
Ting et al.

(10) Patent No.: US 9,666,803 B2
(45) Date of Patent: May 30, 2017

(54) PHOTOELECTRODE AND METHOD FOR PREPARING THE SAME

(71) Applicant: National Cheng Kung University, Tainan (TW)

(72) Inventors: Jyh-Ming Ting, Tainan (TW); Chun-Ren Ke, Tainan (TW)

(73) Assignee: NATIONAL CHENG KUNG UNIVERSITY (TW)

( * ) Notice: Subject to any disclaimer, the term of this patent is extended or adjusted under 35 U.S.C. 154(b) by 0 days.

(21) Appl. No.: 14/800,051

(22) Filed: Jul. 15, 2015

(65) Prior Publication Data

US 2016/0013414 A1    Jan. 14, 2016

Related U.S. Application Data (62) Division of application No. 13/534,277, filed on Jun. 27, 2012, now abandoned.

(30) Foreign Application Priority Data

Dec. 21, 2011    (TW) .............................. 100147646 A (51) Int. Cl.
| | |
|---|---|
| *C01G 23/00* | (2006.01) |
| *H01L 51/00* | (2006.01) |
| *H01G 9/20* | (2006.01) |
| *C01G 23/047* | (2006.01) |
| *C01G 23/053* | (2006.01) |
| *B82Y 30/00* | (2011.01) |
| *B82Y 20/00* | (2011.01) |
| *B82Y 40/00* | (2011.01) |

(52) U.S. Cl.
CPC .......... *H01L 51/0021* (2013.01); *B82Y 20/00* (2013.01); *B82Y 30/00* (2013.01); *C01G 23/047* (2013.01); *C01G 23/053* (2013.01); *H01G 9/2031* (2013.01); *B82Y 40/00* (2013.01); *C01P 2002/72* (2013.01); *C01P 2004/03* (2013.01); *C01P 2004/04* (2013.01); *C01P 2004/62* (2013.01); *C01P 2004/64* (2013.01); *C01P 2006/14* (2013.01); *C01P 2006/16* (2013.01); *C01P 2006/40* (2013.01); *H01G 9/2059* (2013.01); *Y02E 10/542* (2013.01); *Y02P 70/521* (2015.11)

(58) Field of Classification Search
CPC .................................................... C01G 23/053
See application file for complete search history.

(56) References Cited

U.S. PATENT DOCUMENTS

| | | | | |
|---|---|---|---|---|
| 2004/0058167 | A1* | 3/2004 | Arbab ..................... | C23C 4/123 428/426 |
| 2006/0174933 | A1* | 8/2006 | Rolison ................ | C01G 23/053 136/256 |
| 2007/0209696 | A1* | 9/2007 | Duerr ................... | H01G 9/2031 136/252 |

OTHER PUBLICATIONS

Durr et al., "Low-temperature fabrication of dye-sensitizedsolar cellsby transfer of composite porous layers," 2005, Nature Materials, vol. 4, pp. 607-611.*

* cited by examiner

*Primary Examiner* — Robert Vetere
(74) *Attorney, Agent, or Firm* — Bacon & Thomas, PLLC (57) ABSTRACT

The present invention relates to an photoelectrode and the preparation method thereof, wherein said photoelectrode comprises a substrate and a titania layer composed of a mesoporous titania bead having a diameter of 200-1000 nm, specific surface area of 50-100 m²/g, porosity of 40-60%, pore radius of 5-20 nm, pore volume of 0.20-0.30 cm³/g, and the titania comprised in the bead is anatase titania.

8 Claims, 7 Drawing Sheets

PHOTOELECTRODE AND METHOD FOR PREPARING THE SAME

BACKGROUND OF THE INVENTION

Field of the Invention

The present invention relates to a photoelectrode and method for preparing the same.

Description of the Related Art

After industrial revolution, fossil fuel consumptions grew dramatically accompanying with the development of science, and resulted in fossil fuel exhaustion and environmental damages. For sustainable survival, the development of renewable and alternative energy was the ultimate goal of the world. In all alternative energies, solar energy caught people's attention because it was abundant and clean, and many companies had invested in the associated research and development.

Solar cell, also called photovoltaic cell, was a device for converting light energy into electrical energy. However, lots of energy was consumed during the manufacture of solar cells, so it was still a challenge for solar cells to reach grid parity. At present, most commercial solar cells were silicon solar cells, in which monocrystalline silicon solar cells and multicrystalline silicon solar cells had a cell efficiency of 18% and 17%, respectively. But the cost of silicon solar cells was high because pure crystalline silicon materials were widely used in semiconductor industry. Materials generally used for non-silicon thin-film solar cells were cadmium telluride (CdTe) or copper indium gallium diselenide (CIGS, CuInGaSe), in which the former material was mainly used by First Solar for manufacturing solar cells with the lowest price per watt in all commercial solar cells, but cadmium contamination was a concerned issue; and the latter material could be used for manufacturing stable solar cells with high efficiency and long life span, but the complicated element composition caused low yield rate.

A solar cell promising for dramatically reducing electricity cost was dye-sensitized solar cell (DSC), which was published on Nature in 1991 (B. Oregan and M. Grätzel, "A Low-Cost, High-Efficiency Solar-Cell Based On Dye-Sensitized Colloidal $TiO_2$ Films," Nature, 353 (6346), 737-740, 1991). DSC had advantages that it cost less and could be applied to flexible applications. Comparing with silicon solar cells, it was less influenced by incident angle and increased temperature, so the DSC was very competitive and potential to lead the trend of the next generation solar cells. There had been many commercial DSCs in the market, for example, Sharp had manufactured a DSC having a high cell efficiency of 10.4%. Generally, DSC had a shorter life span and lower cell efficiency; however, if these disadvantages were overcome, it would be the most widely used solar cell in the future.

In DSCs, the photoelectrode was important for loading dye molecules and transferring electrons, and it was the key to decide cell efficiency. The main material for producing the photoelectrode was titania nanoparticles. Titania ($TiO_2$) was a stable, non-toxic material with high refractive index (n=2.4-2.5), and widely used in our daily life, such as in white pigment, tooth paste, cosmetics or food. The naturally occurring titania had three main crystal phases: rutile, anatase and brookite, in which the rutile titania was the most stable crystal phase in view of thermodynamics; but the anatase titania was suitable for cell applications because it had a greater energy band gap and a higher conduction band, so the anatase titania could reach a greater quasi-Fermi energy level and open circuit voltage under the same electron concentration, thereby achieving a better cell efficiency.

Regarding with the morphology of titania, the titania nanoparticles (NPs) was widely applied to DSCs because it had a high specific surface area which was able to absorb a large amount of dye. However, NPs did not have an oriented structure, and the electrons immigrated in random directions, so the electron collection efficiency was limited. In addition, the particle size of NPs was too small to produce effective visible light scattering and good light harvesting. Therefore, many strategies had been taken to solve this problem, for example, M. Zukalova et al. produced an oriented particle by polymer template method and the resulted cell efficiency was higher than that of non-oriented particle by 1.3% (Nano Letters, 5 (9), 1789-1792, 2005); J. M. Macak et al. prepared a $TiO_2$ nanotube with high aspect ratio by anodization (Angewandte Chemie-International Edition, 44 (14), 2100-2102, 2005) and J. R. Jennings et al. produced a photoelectrode from $TiO_2$ nanotube and titanium substrate, giving a electron collection efficiency of nearly 100% (Journal of the American Chemical Society, 130 (40), 13364-13372, 2008), which demonstrated that tubular or linear structures provide a better diffusion direction for electrons; and K. Shankar et al. proved that when a glass substrate was used instead, the cell efficiency would reached 6.1% (Nano Letters, 8 (6), 1654-1659, 2008). Nevertheless, the structure of nanotube and the like did not provide sufficient dye-loading, so the other structures derived from nanoparticles were still under research and development.

Another way to solve the low dye-loading problem was to use the structure called $TiO_2$ beads (see D. H. Chen et al., Advanced Materials, 21 (21), 2206, 2009 and Y. J. Kim et al., Advanced Materials, 21 (36), 3668, 2009). The $TiO_2$ bead with submicron-meter size had the following advantages: (1) this bead dramatically increased light harvesting efficiency because its size was large enough for Mie scattering, so the light route in the photoelectrode lengthens and dye loading increased; (2) this bead had a large surface area, which helped dye loading; (3) $TiO_2$ bead had regular mesopores that increased electron transfer and helped mass transfer of electrolyte. However, this two-layer photoelectrode was only applied to rigid DSCs, not introduced into flexible dye-sensitized solar cells (FDSCs). This was because there were less contacts between large size $TiO_2$ beads and the substrate, so the photoelectrode was not well-attached on the substrate, and this highlighted the disadvantage of FDSCs. In recent studies, the best cell efficiency of the flexible low-temperature glass DSCs using $TiO_2$ beads was 6.3% (S. H. Jang et al., Electrochemistry Communications, 12 (10), 1283-1286, 2010). $TiO_2$ was not used in the general flexible plastic substrates because the plastic substrates could only be processed at 150° C. or less and they could not bear the high temperature treatment for removing organic compounds and sintering $TiO_2$ beads on the traditional rigid substrates (about 450° C.). Therefore, the DSCs using $TiO_2$ beads had low electron collection efficiency and reduced cell efficiency.

SUMMARY OF THE INVENTION

The inventors were the first to use mesoporous titania beads for manufacturing the photoelectrode of cells, and they surprisingly found that the anatase $TiO_2$ comprised in the mesoporous titania beads and the oriented attachment between crystal grains increased electron diffusion. In addition, the $TiO_2$ beads with submicron-meter size of the present invention resulted in excellent light scattering. With these advantages, the titania bead of the present invention can be used to give high efficiency cells.

One object of the present invention is to provide a photoelectrode comprising a titania layer composed of a mesoporous titania bead, and said mesoporous titania bead comprises anatase titania, which provides excellent light scattering and increases dye-loading.

Another object of the present invention is to provide a method for preparing the photoelectrode, wherein a titania layer composed of a mesoporous titania bead is formed on a substrate.

To achieve these objects, the present invention provides a photoelectrode, comprising (1) a substrate; and (2) a titania layer composed of a mesoporous titania bead having a diameter of 200-1000 nm, specific surface area of 50-100 $m^2/g$, porosity of 40-60%, pore radius of 5-20 nm, pore volume of 0.20-0.30 $cm^3/g$, and the titania comprised in the bead is anatase titania.

In a preferred embodiment, said mesoporous titania bead has a diameter of 500-1000 nm; and more preferably, 750-1000 nm.

In a preferred embodiment, said mesoporous titania bead has a porosity of 50%.

In a preferred embodiment, the titania layer has a thickness of 5-10 μm; more preferably, 7.5-8 μm.

In a preferred embodiment, said substrate is a metal substrate, or a transparent non-conductive substrate covered by a transparent conductive film. Preferably, said transparent non-conductive substrate is a plastic or glass substrate, and said transparent conductive film is ITO, FTO or other transparent conductive oxide (TCO) film; more preferably, said plastic substrate is PEN or PET substrate; and most preferably, the substrate of the present invention is ITO-PEN substrate, ITO-glass substrate, FTO-PEN substrate, titanium substrate or stainless steel substrate.

In a preferred embodiment, said mesoporous titania bead is prepared by the following steps:
  (1) adding a steric agent and a titanium-containing precursor into ethanol to proceed sol-gel reaction and give a sol-gel product, wherein the molar ratio of said steric agent:said titanium-containing precursor:ethanol is 0.1-1:1:200-300; and
  (2) heating said sol-gel product in water at 120-200° C. for 1-24 hours to obtain the mesoporous titania bead.

In a preferred embodiment, said steric agent is a tertiary amine; more preferably, said steric agent is selected from hexamine, trimethylamine (($CH_3)_3N$), quinoline ($C_9H_7N$), isoquinoline ($C_9H_7N$) or methyldiethylamine ($CH_3N(CH_2CH_3)$); and most preferably, said steric agent is hexamine.

In a preferred embodiment, said titanium-containing precursor is selected from titanium tetraisopropoxide, titanium tetrachloride, titanium trichloride, ethyl orthotitanate or $Ti(OC_4H_8)_4$; and most preferably, said titanium-containing precursor is titanium tetraisopropoxide (TTIP).

In a preferred embodiment, said step (2) is preferably conducted at a temperature of 160-200° C.; more preferably, at 200° C.

In a preferred embodiment, the method further comprises adding a salt into said ethanol in step (1) to adjust ionic strength to $1\times10^{-4}$-$32\times10^{-4}$; more preferably, said salt is selected from KCl, LiCl, NaCl, KCl, LiF, NaF, KF, LiBr, NaBr, KBr, LiI, NaI, KI, CsCl, CsI, CsBr, $KNO_3$; and most preferably, said salt is KCl.

In a preferred embodiment, said titania layer increases scattering efficiency and used as a scattering layer.

In a preferred embodiment, a titania nanoparticle layer is further comprised between said substrate and said titania layer; preferably, said titania nanoparticle layer has a thickness of 3-5 μm.

In a preferred embodiment, said titania nanoparticle layer is composed of a titania nanoparticle, not composed of said mesoporous titania bead; more preferably, said titania nanoparticle of the titania nanoparticle layer is P25, ST-01, ST-21, ST-31, TTO-55S or ST-30L.

In a preferred embodiment, said photoelectrode is used for manufacturing a cell.

The present invention also provides a method for preparing the above-mentioned photoelectrode, comprising:
  (1) providing a substrate;
  (2) coating a mesoporous titania bead on said substrate to obtain a coated layer, in which said bead has a diameter of 200-1000 nm, specific surface area of 50-100 $m^2/g$, porosity of 40-60%, pore radius of 5-20 nm, pore volume of 0.20-0.30 $cm^3/g$, and the titania comprised in the bead is anatase titania; and
  (3) pressing the coated layer from step (2) under room temperature to obtain said titania layer.

In a preferred embodiment, said substrate provided in the above-mentioned method is a metal substrate, or a transparent non-conductive substrate covered by a transparent conductive film. Preferably, said transparent non-conductive substrate is a plastic or glass substrate, and said transparent conductive film is ITO, FTO or other transparent conductive oxide (TCO) film; more preferably, said plastic substrate is PEN or PET substrate; and most preferably, the substrate is ITO-PEN substrate, ITO-glass substrate, FTO-PEN substrate, titanium substrate or stainless steel substrate.

In a preferred embodiment, the above-mentioned method further comprises the following step between step (1) and step (2): coating a titania nanoparticle on said substrate to obtain a titania nanoparticle layer, and said titania nanoparticle is not said mesoporous titania bead; preferably, said titania nanoparticle of the titania nanoparticle layer is P25, ST-01, ST-21, ST-31, TTO-55S or ST-30L.

In a preferred embodiment, the above-mentioned method is applied to cell manufacture.

The present invention has proved that the properties of titania, such as crystallinity, surface oxygen vacancy concentration and the like, affect diffusion and life span of electrons, thereby affecting charge collection efficiency. And, the size of titania bead apparently affects the efficiency of light harvesting and electron injection, thereby affecting the cell efficiency. The mesoporous titania bead, or the mesoporous titania bead prepared by the method of the present invention, has a proper size, good crystallinity and low surface oxygen vacancy concentration. Moreover, it is also potential to be used as a scattering layer, which is suitable for manufacturing photoelectrode of cells, and enhancing cell efficiency.

DETAILED DESCRIPTION OF THE PREFERRED EMBODIMENTS

All scientific terms hereinafter are given their ordinary meaning in the usage of the field of the invention, unless the text of the patent makes clear that a term is used with a special meaning.

The term "titania layer" used herein refers to a $TiO_2$ layer prepared by the mesoporous titania beads of the present invention, which is able to increase scattering efficiency and used as a scattering layer. The titania layer has a thickness of 5-10 μm, preferably, 7.5-8 μm.

The term "titania nanoparticle layer" used herein refers to a $TiO_2$ layer prepared by titania nanoparticles, and said titania nanoparticles are not the mesoporous titania beads of the present invention or the mesoporous titania beads prepared by the method of the present invention. The titania nanoparticle can be a commercial nanoparticle, such as P25, ST-01, ST-21, ST-31, TTO-55S and ST-30L, and the titania nanoparticle layer has a thickness of 3-5 μm.

The term "substrate" used herein refers to a conductive substrate, comprising but not limit to: a metal substrate, and a transparent non-conductive substrate covered by a transparent conductive film. Preferably, said transparent non-conductive substrate covered by a transparent conductive film is a plastic or glass substrate covered by a transparent conductive film. More preferably, said transparent conductive film is ITO, FTO or other transparent conductive oxide (TCO) film; and said plastic substrate is PEN or PET substrate. The examples of the substrate used in the present invention are ITO-PEN substrate, ITO-glass substrate, FTO-PEN substrate, titanium substrate, stainless steel substrate.

Preparation of the Titania Products of the Present Invention

The titania products of the present invention were prepared by a novel two-step process, comprising the first sol-gel reaction step, and the second water-heating treatment step.

(1) Sol-Gel Reaction

First, 0.25 g, 0.50 g or 0.75 g of the steric agent, hexamine (Riedel-de haen, 99.5%), was added into 200 mL of ethanol (J-T baker, 99.9%), and stirred with a magnetic bar. Several minutes later, 1 mL KCl ionic solution (0.1M) prepared by solid KCl (SHOWA, 99.5%) was added into hexamine solution in ethanol to adjust the ionic strength. Several minutes later, hexamine is dissolved completely, and 4.4 mL of the titanium-containing precursor, titanium tetraisopropoxide (TTIP) (Acros, >98%) was added to start hydrolysis reaction, and the solution was turned from transparent into white in minutes, which showed the proceeding of condensation reaction. The solution was further stirred for several minutes and stood for one day to complete the sol-gel reaction. On the next day, the solution was filtered and dried, and ground to give an amorphous white powder (TiOx), which was named as a sol-gel product hereinafter.

(2) Water-Heating Treatment 0.4 g of the sol-gel product obtained from the previous step was added into 25 mL of deionized water and stirred for several minutes, and then the mixture was placed in autoclave and stayed at 120° C., 160° C. or 200° C. for 6 hours to proceed water-heating treatment. After that, the solution was filtered and dried to obtain a crystallized white powder, namely, the titania product of the present invention.

Preparation of Photoelectrode

The titania product of the present invention and a commercial titania powder P25 (Degussa) were used for the following preparations.

First, a titania slurry was prepared. The above-mentioned two titania had different surface characteristics, so different formulations were used for their preparations: 0.6 g of P25 powder, 100 μL of acetic acid (J-T baker, 99.9%), 0.5 mL of deionized water, 2.5 mL of ethanol and 4 mL of tert-butanol (Merck, >99%) were mixed, and stirred and sonicated alternating to obtain a homogeneous and thick P25 slurry. In addition, 0.3 g of the titania product of the present invention, 1.5 mL of ethanol and a trace of HCl (Aldrich, 37%) were mixed, then the titania slurry of the present invention was prepared by the steps the same as the previous description.

An appropriate amount of the titania slurry of the present invention (or P25 slurry) was dropped on a ITO-PEN substrate, and spin-coated by a two-step spin-coating process: the first step was proceed at 700 rpm for 20 seconds, and the second step wad proceed at 1500 rpm for 20 seconds. After that, the coated substrate was dried naturally. The spin-coating process was repeated until the titania coating has a desired thickness, and then the coating was scraped into a size of 4×4 mm square (0.16 cm²). Then the pressing step under room temperature was taken, which means a pressure of 50 kg/cm² was given in a direction from the titania coating to the ITO-PEN substrate for 5 minutes to enhance the adherence between the photoelectrode and the ITO-PEN substrate and the connection between the titania beads of the present invention. At last, a photoelectrode (anode) comprising a titania bead layer was obtained.

Preparation of Dye-Sensitized Solar Cell

Dye-sensitized solar cell was practiced as the embodiment of the present invention, in which N719 (Solaronix) was used as the dye comprised in the cell. 0.05 g of solid N719 was added into 100 mL of ethanol, and stirred and sonicated to obtain a N719 solution having a concentration of $5×10^{-4}$ M, then the solution was aliquoted and stored in the dark.

The obtained photoelectrode was soaked into the N719 solution for about one day, so the time was sufficient for dye to be loaded on the surface of the titania product of the present invention. After soaking, the photoelectrode was removed and soaked into ethanol for about 10 minutes in order to remove the extra dye aggregates. After that, the photoelectrode was removed and dried, and ready for cell assembly.

A counter electrode (cathode) was prepared separately. A vacuum platinum coater (JEOL 1600) was used to coat Pt on an ITO-PEN substrate with a current of 20 mA for 200 seconds. And, an electrolyte was prepared by MPN (Alfa Aesar, 99%) as a solvent, and 0.1M LiI (Aldrich, 99.99%), 0.05M 12 (Aldrich, 99.999%), 0.5M TBP (Aldrich, 99%) and 0.6M DMPII (Solaronix).

At last, the dye-sensitized solar cell was assembled. A spacer with pores (Surlyn) and having a thickness of 60 μm and a width of 0.6 cm was placed on the substrate of the photoelectrode, and then covered by the counter electrode, so that the two pores on the spacer were located on the diagonal line of the photoelectrode for injecting electrolyte therein. When all elements were set at the correct positions, the photoelectrode, spacer and counter electrode were fixed by clamps and heated to melt the spacer and adhere the upper and lower electrodes. The assembly was then cooled naturally and then the electrolyte was injected. After electrolyte injection, the pores of the spacer were sealed to avoid the evaporation of electrolyte, which may cause degeneration of the cell. When the cell assembly was completed, the cell was objected to the determination of cell efficiency.

The following examples are provided to elucidate the present invention, not to limit the scope of the present invention. Those skilled in the art will recognize and understand them without further explanation. All the references are hereby incorporated by reference in its entirety herein.

EXAMPLES

Example 1

Analysis of the Titania Products of the Present Invention

A series of titania products were prepared by using different amount of steric agent (0.25 g, 0.50 g or 0.75 g) and heating at different temperature (120° C., 160° C. or 200° C.) in water-heating treatment. These titania products were labeled with the letter "H" to show that there were obtained after water-heating treatment. For example, "H 0.25 120" represents the titania product prepared by using 0.25 g of steric agent (hexamine) and heating at 120° C. in water-heating treatment by the preparation method of the present invention.

I. Crystal Structure Analysis of the Titania Product of the Present Invention

The titania products of the present invention were objected to XRD phase identification and electron microscope analysis to identify if these products had a long-range order crystal structure, namely, the structure of anatase titania.

First, the titania products of the present invention were separately dried at 60° C. for one day to remove water and volatile organic compounds, thereby reducing the noise of data. Then the dried titania products prepared under a variety of process parameters were separately detected by X-ray diffraction (XRD) in Rigaku D-max XRD with Cu-K$_a$ radiation having a wavelength of 0.154 nm as the incident light, a scan range (two theta) of 20° to 80°, and the scanning rate of 3° per minute.

Figure 1:
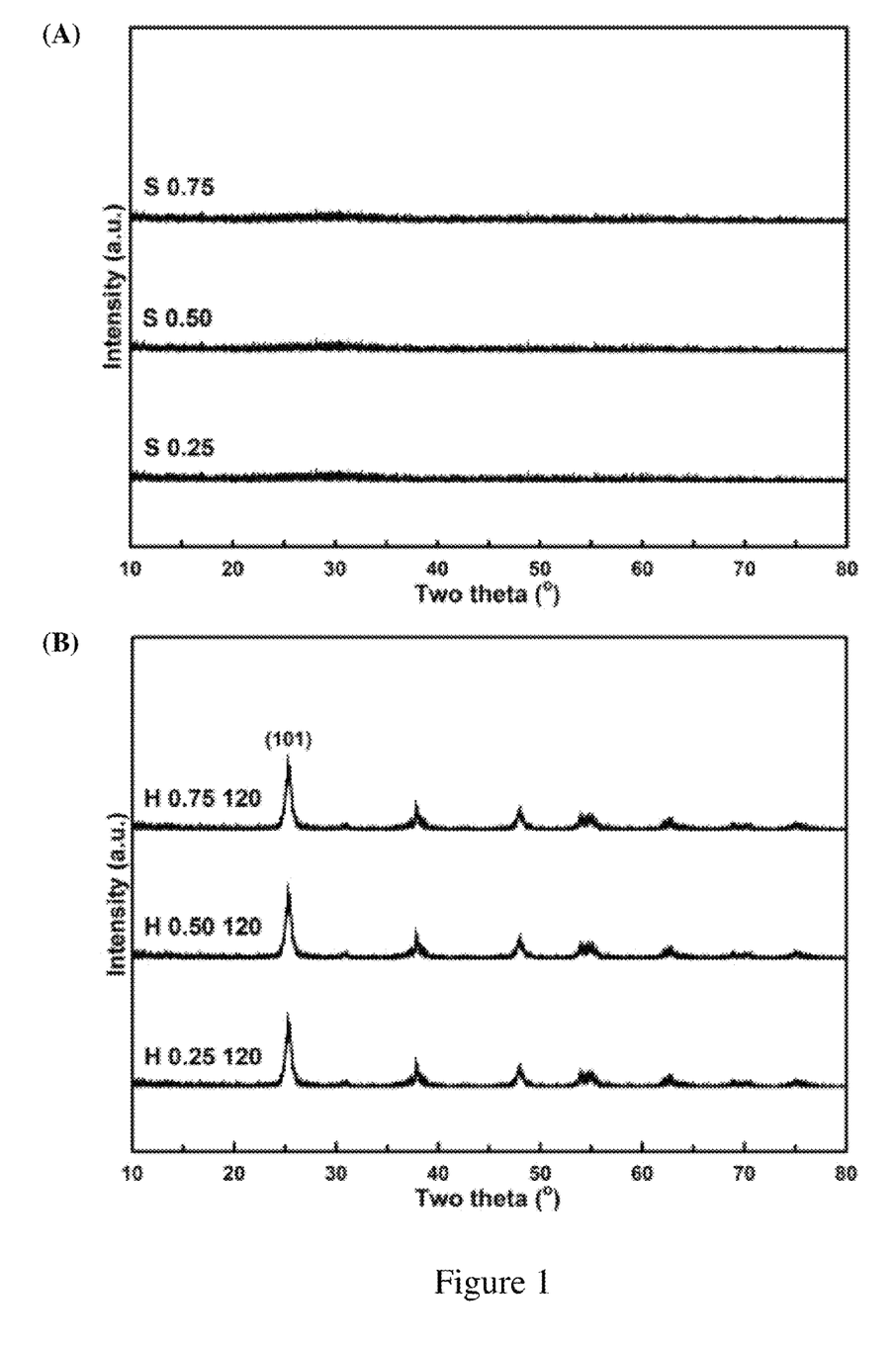
In FIG. 1, (A) shows the XRD diffraction diagrams of the sol-gel products (S) obtained by using different amount of steric agent; and (B)-(D) show the XRD diffraction diagrams of the titania products of the present invention (H). The first number after the letter "H" represents the amount of steric agent, and the second number represents the water-heating temperature.

In FIG. 1, (A) shows the XRD diffraction diagrams of the sol-gel products obtained by using different amount of steric agent (without water-heating treatment, labeled with the letter "S"). Regardless of the amount of steric agent, all diffraction diagrams have no diffraction peak, and this shows that all sol-gel products have an amorphous structure, not a long-range order structure.

Figure 3:
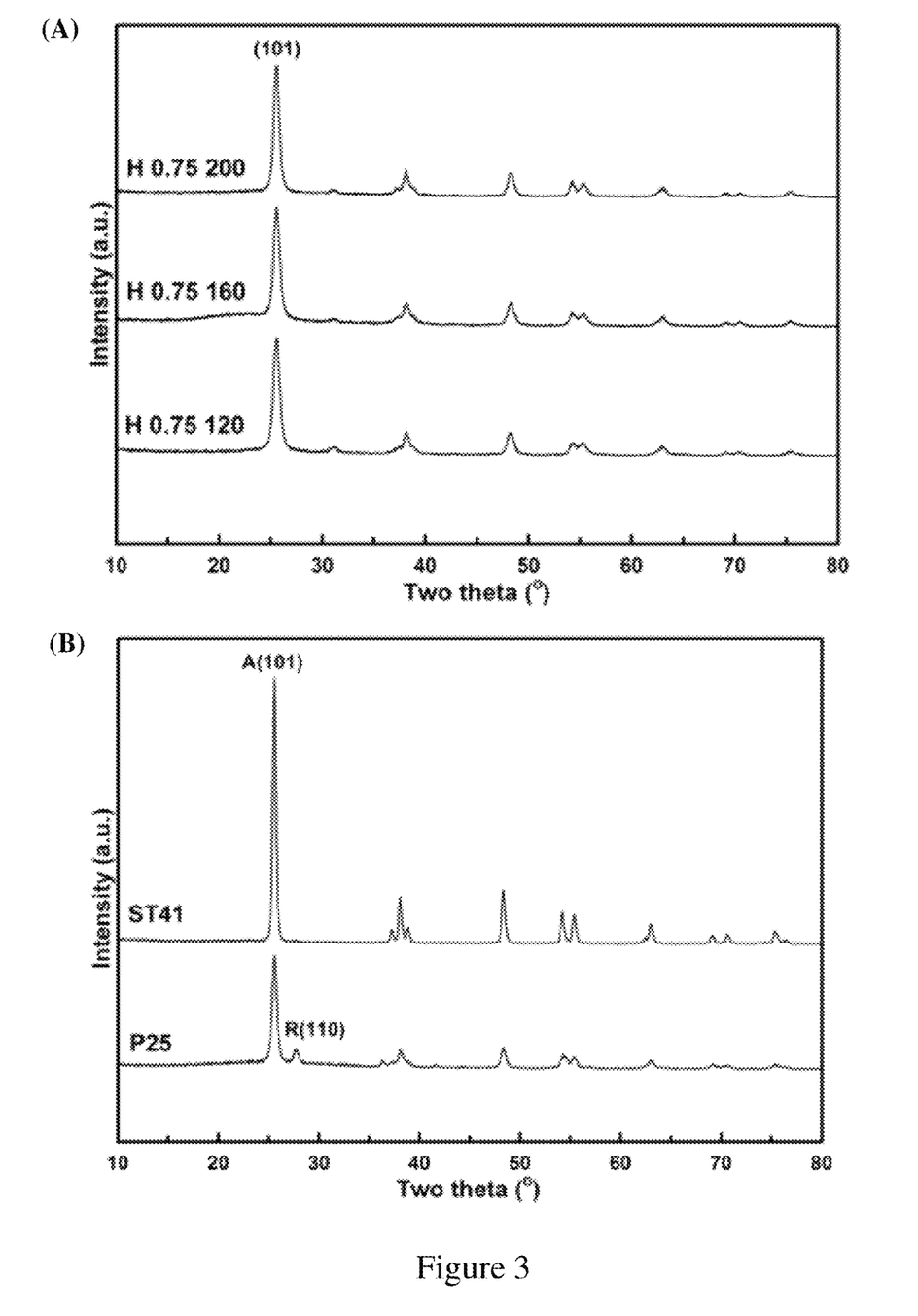
In FIG. 3, (A) shows the XRD diffraction diagrams of the titania beads prepared by using different amount of steric agent and heated at different temperature in water-heating step in the present invention; and (B) shows the XRD diffraction diagrams of the commercial titania powders, P25 and ST41.

In FIG. 1, (B)-(D), the XRD diagrams show that the crystal structures of all titania products of the present invention are the same regardless of the amount of steric agent and the temperature of water-heating treatment. After comparison with JCPDS 11-1272, the peak of these XRD diagrams was identified as the diffraction peak of anatase titania, in which the highest main peak was the (101) face of anatase, and the two *theta* was located at 25.3°. This result completely matches the JCPDS standard, which shows that the titania product of the present invention is anatase titania with a long-range order structure not stretched or pressed by additional stress. In this study, the amount of steric agent does not affect the crystal structure of the titania products of the present invention because the diffraction peak strength, the full width at half maximum (FWHM) and the diffraction angle of these products are almost the same, and it also proves that hexamine does not embed into the structure of $TiO_2$ (0-Ti-0). That is to say, hexamine is not involved in the chemical reaction, and it is a true steric agent. However, both the diffraction peak strength and FWHM are different between the titania products obtained by heating different temperatures in water-heating treatment. In FIG. 3, (A), for example, the diffraction diagrams of the titania products obtained by using 0.75 g of steric agent and heating at different temperatures in water-heating treatment are compared, and it is found that when the temperature of water-heating treatment increases, the strength of the (101) peak and other peaks increases, and the FWHM narrows. In other words, the crystallinity of the anatase titania powder increases when the temperature increases. In addition, Debye-Scherrer equation is used to evaluate the grain size of the titania products obtained under a variety of process parameters, and it is found that when the temperature of water-heating treatment increases, the grain size also increases (14 nm, 18 nm, 20 nm)—these are size of monocrystalline nanoparticles suitable for manufacturing photoelectrode of cells. XRD values and grain sizes are shown in Table 1.

TABLE 1

XRD value and grain size of titania products obtained under a variety of process parameters

| Sample | Diffraction angle two theta of (101) peak (°) | FWHM of (101) peak | Grain size of (101) peak (nm) |
|---|---|---|---|
| H 0.25 120 | 25.30 | 0.572 | 14.2 |
| H 0.25 160 | 25.28 | 0.464 | 17.5 |
| H 0.25 200 | 25.30 | 0.407 | 20.0 |
| H 0.50 120 | 25.32 | 0.581 | 14.0 |
| H 0.50 160 | 25.31 | 0.462 | 17.6 |
| H 0.50 200 | 25.30 | 0.404 | 20 |
| H 0.75 120 | 25.29 | 0.576 | 14 |
| H 0.75 160 | 25.32 | 0.455 | 18 |
| H 0.75 200 | 25.30 | 0.411 | 20 |

The inventors observed the diffraction diagrams of these products obtained after water-heating treatment, and found that there were slightly rises and falls around 31°. After comparison with JCPDS 29-1360, it was identified as (121) face of brookite, located at 30.8° (data not shown). After integration calculation, it was found the content of brookite in all products was less than 1%, which did not shift the diffraction peak of anatase, and so it could be recognized as a noise. In other words, the powder obtained in this study can be recognized as pure anatase, and this crystal structure is suitable for manufacturing a photoelectrode of cells.

Figure 2:
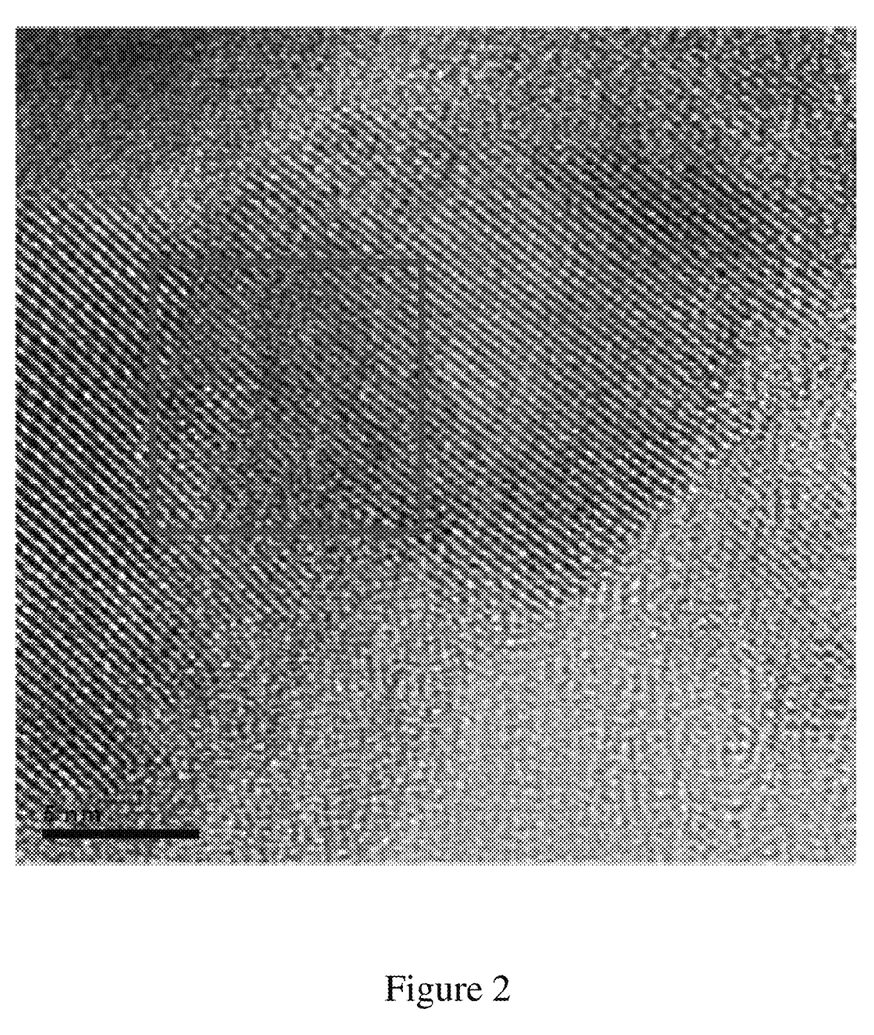
FIG. 2 shows the HRTEM image of the mesoporous titania bead prepared by using 0.75 g steric agent and heating at 200° C. in water-heating treatment in the present invention.

Moreover, JEOL JEM 2100F high-resolution transmission electron microscope (HRTEM) was used to identify the crystal structure of these powders. The HRTEM image of sample "H 0.75 200" is shown in FIG. 2, in which the parallel black lines represent the location of crystal faces. After magnification measurement, it is found the distance between these faces (d) is 0.35 nm, the same as that of the (101) face of anatase. The square represents the connection of two grains, and it shows that the (101) faces of two grains attach in the same direction, which means an oriented attachment is formed. When the temperature of water-heating treatment is 160° C., an excellent oriented attachment is obtained; and when the temperature of water-heating treatment is low (120° C.), the crystallinity of the product is low and amorphous structure is formed (data not shown). The above HRTEM data shows that the proportion of amorphous structure reduces when the temperature of water-heating treatment increases, and this result is fully supported by XRD results.

II. Crystal Structure Analysis of the Titania Layer of the Present Invention

The titania products of the present invention and/or a commercial titania powder (P25 or ST41) were used to prepare the titania layers of photoelectrodes as foresaid, and Rigaku D-max2500 XRD was used to analyze their crystal structures. Rigaku D-max2500 XRD is similar to Rigaku D-max XRD, but it is equipped with wide-angle function, and capable for glancing incident angle diffraction, so the extra signals from the substrate can be eliminated. Therefore, it is suitable for analyzing thin-film samples, especially the thin-film samples having a thickness of 2 μm or less.

The mesoporous titania beads prepared by using 0.75 g of steric agent and heating at different temperature at the water-heating treatment and the commercial titania powders ST41 and P25 were independently used to prepare a layer made of $TiO_2$ of photoelectrode, and then objected to XRD analysis. The results are shown in FIG. 3, (A) and (B).

Similar with the foresaid crystal structure analysis, when the temperature of water-heating treatment increases, the crystallinity of the obtained mesoporous titania beads of the present invention also increases. After comparison with JCPDS 21-1272, it was found that the mesoporous titania beads of the present invention still had an anatase structure, and their diagrams were same as the commercial anatase titania powder ST41. ST41 had an obviously better crystallinity than the mesoporous titania beads of the present invention, but it was a submicron scale powder, and not suitable for manufacturing the photoelectrode of cells. In addition, after comparison with JCPDS 21-1276, it was also found that the commercial titania powder P25 has a proportion of rutile structure with the main diffraction peak of (110) face at 27.4°, as described in the instruction sheet of manufacturer (data not shown). So the P25 powder was also not suitable for manufacturing the photoelectrode of cells. The XRD data and grain size of these layers made of the titania products of the present invention are listed in Table 2. From these data, it is clear that the tendency of increased temperature in water-heating treatment results in increased grain size is the same. Meanwhile, it also proves that the crystal structure of the titania product of the present invention does not change even after the titania product is manufactured as a thin-film of photoelectrode.

TABLE 2

XRD value and grain size of the layers prepared by the titania products of the present invention

| Sample | Diffraction angle two theta of (101) peak (°) | FWHM of (101) peak | Grain size of (101) peak (nm) |
|---|---|---|---|
| H 0.25 120 | 25.30 | 0.572 | 14.2 |
| H 0.25 160 | 25.28 | 0.464 | 17.5 |
| H 0.25 200 | 25.30 | 0.407 | 20.0 |
| H 0.50 120 | 25.32 | 0.581 | 14.0 |
| H 0.50 160 | 25.31 | 0.462 | 17.6 |
| H 0.50 200 | 25.30 | 0.404 | 20 |
| H 0.75 120 | 25.29 | 0.576 | 14 |
| H 0.75 160 | 25.32 | 0.455 | 18 |
| H 0.75 200 | 25.30 | 0.411 | 20 |

The oxygen vacancy concentration can be calculated through detecting the content of $Ti^{3+}$ in the titania products of the present invention (data not shown), thereby evaluating the proportion of defects caused by oxygen vacancy concentration. Relatively, surface oxygen vacancy carries positive charges, and results in trap states to stop electron immigration. The inventors have found that the beads prepared at a higher temperature in water-heating treatment not only have an increased crystallinity of anatase, but also have a reduced oxygen vacancy concentration, which are advantageous for the following manufacture of photoelectrode and cells.

III. Morphology Analysis of the Titania Product of the Present Invention

JEOL 6701F scanning electron microscope (SEM) was used to identify the shape and size of the titania products of the present invention.

Figure 4:
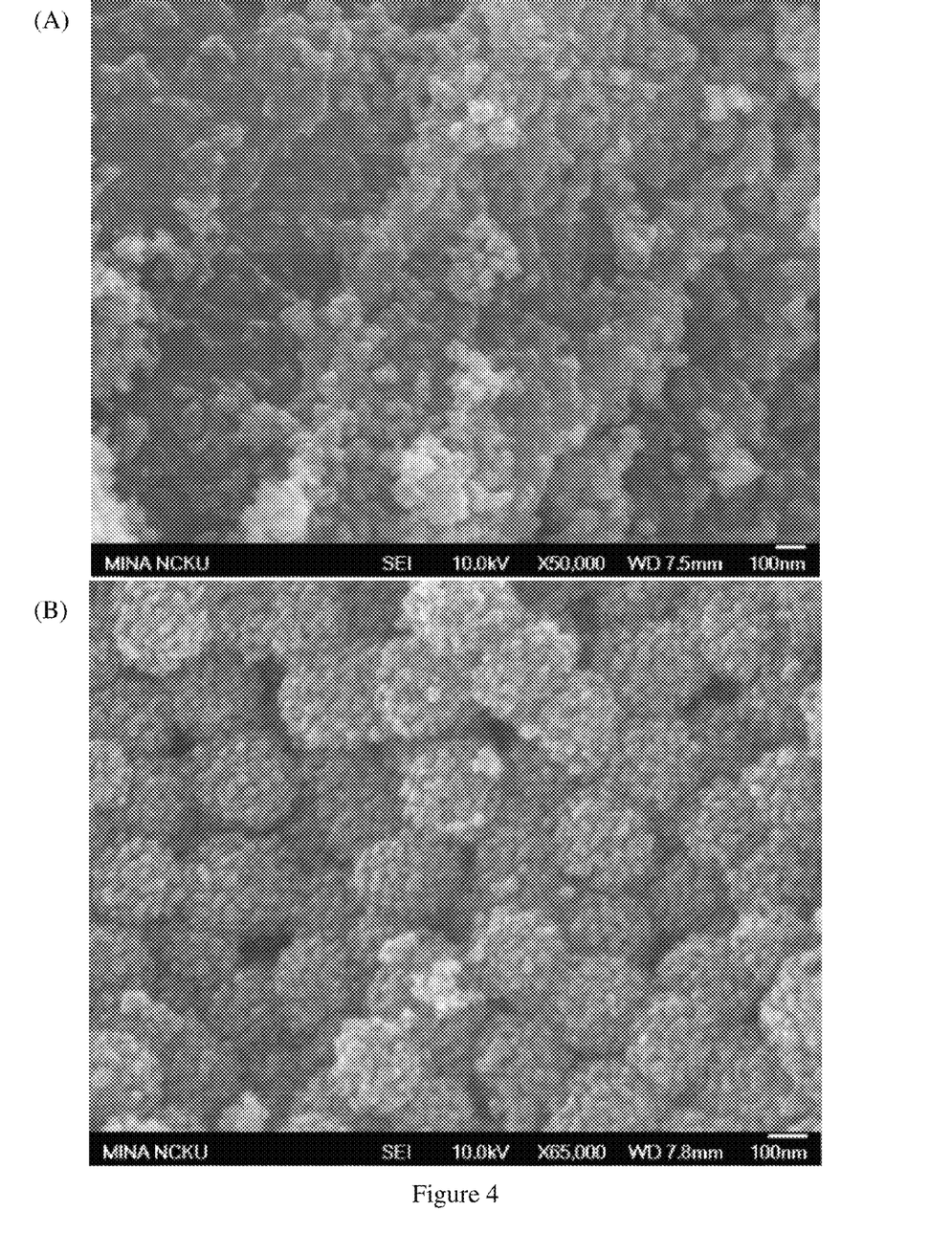
FIG. 4 shows the SEM images of the titania products prepared by using (A) 0.25 g, (B) 0.50 g, (C) 0.75 g of steric agent and heated at 200° C. in water-heating step in the present invention.

FIG. 4 shows the SEM images of the titania products of the present invention prepared by using different amount of steric agent and heating at 200° C. in water-heating treatment, in which (A) H 0.25 200 has an irregular shape; and (B) H 0.50 200 and (C) H 0.75 200 have formed analogous spheres, also named as "bead" herein. In addition, when the amount of steric agent increases, the surface roughness of the beads reduces, which means the steric agent helps the formation of sphere structure. The shape of H 0.75 200 is more closed to a sphere than H 0.50 200, and the distance between the analogous spheres of H 0.75 200 is obviously increased. This is also supported by the other titania products of the present invention obtained under other process parameters. Comparing with the amorphous sol-gel products (S) prepared by using different amount of steric agent (data not shown), the titania products' of the present invention generally maintain the morphology of sol-gel products (irregular or analogous sphere), but they are all crystallized to be anatase titania, their atomic arrangement is changed from disorder structure into long-range order structure, and a new surface is formed. The temperature of water-heating treatment affects the bead size, as shown in Table 3.

TABLE 3

Bead diameter of the titania products of the present invention

| Sample | Size of sol-gel products (nm) | Size of beads (nm) |
|---|---|---|
| H 0.75 120 | 375 | 375 |
| H 0.50 160 | 250 | 250 |
| H 0.75 160 | 375 | 750 |
| H 0.50 200 | 250 | 250 |
| H 0.75 200 | 375 | 500 |

*The sizes of the mesoporous titania beads of the present invention are diversely distributed, and the data in Table 3 are average values. The real size range is about ±50-±100 nm.

The above results show that even the steric agent does not affect the crystal structure, but its molecular structure provides an effective space between the analogous sphere beads. Comparing with the most well-known steric agent used in the art is hexadecylamine (HAD), the steric agent used in the present invention, hexamine, is a tertiary amine in which the nitrogen atoms are shielded by carbon atoms, and not react with the structure of titania (O—Ti—O), thereby avoiding extra doping and disadvantageous influences to the crystal structure of the product given after water heating treatment. Therefore, hexamine should be a better steric agent. Furthermore, the amount of steric agent affects the shape, size and surface structure of the titania particles. If the amount of steric agent is not enough, irregular nanoparticles will be formed as the final product, and the beads will not be formed.

IV. BET Analysis of the Titania Product of the Present Invention

Micromeritics ASAP2010 physisorption analyzer was used to proceed Brunauer-Emmett-Teller analysis (BET analysis) to the titania products of the present invention, in which the absorption and desorption of nitrogen were detected under a vacuum degree of $10^{-3}$ torr or less and a temperature of 77K (liquid nitrogen) to analyze the specific surface area, pore radius, pore volume, porosity and the like of the samples. The data are shown in the following Tables 4 and 5.

TABLE 4

BET analysis result of the titania products of the present invention obtained by heating at different temperatures in water-heating treatment

| Sample | Specific surface area ($m^2/g$) | Pore radius (nm) | Pore volume ($cm^3/g$) | Porosity (%) |
|---|---|---|---|---|
| S 0.75 | 180 | 2.5 | 0.11 | 30 |
| H 0.75 120 | 95 | 11.6 | 0.27 | 51 |
| H 0.75 160 | 69 | 16.0 | 0.27 | 51 |
| H 0.75 200 | 62 | 16.1 | 0.25 | 49 |
| P25 | 55 | 9.7 | 0.13 | 34 |

TABLE 5

BET analysis result of the titania products of the present invention obtained by using different amount of steric agent

| Sample | Specific surface area ($m^2/g$) | Pore radius (nm) | Pore volume ($cm^3/g$) | Porosity (%) |
|---|---|---|---|---|
| S 0.25 | 182 | 2.4 | 0.10 | 28 |
| S 0.50 | 180 | 2.5 | 0.11 | 30 |
| S 0.75 | 180 | 2.5 | 0.11 | 30 |
| H 0.25 200 | 63 | 16.5 | 0.26 | 50 |
| H 0.50 200 | 62 | 17.7 | 0.27 | 51 |
| H 0.75 200 | 62 | 16.1 | 0.25 | 49 |

Specific surface area affects two factors important to cell efficiency, that is, the dye loading and light harvesting of dye-sensitized solar cells. Generally speaking, nanoparticles have greater specific surface area and can be applied to more applications. From the above Tables 4 and 5, however, it is found that the sol-gel products have a high specific surface area, but they are amorphous and not suitable for cell applications. Usually, pore radius has a negative correlation with specific surface area, and blocks the mass transfer of dye and electrolyte. But the pores (mesopore in the present invention) of the titania beads have greater pore radius and volume than P25. For example, H 0.75 200 of the present invention has a specific surface area similar with P25, but its pore size and volume are almost twice than those of P25. This is resulted from the difference in their structure. In addition, the mesoporous titania bead of the present invention has a porosity of about 50%, which is suitable for manufacturing photoelectrodes.

From the data shown in Table 5, it is found that the amount of steric agent does not obviously affect the specific surface area and pore radius of the titania products of the present invention, which means, it does not affect the morphology of the beads. Additionally, the microscopic observation has proved that although H 0.25 200 is a nanoparticle, but it has a pore volume similar with that of beads. That is to say, although H 0.25 200 has an irregular structure, it has mesopores.

Example 2

Figure 5:
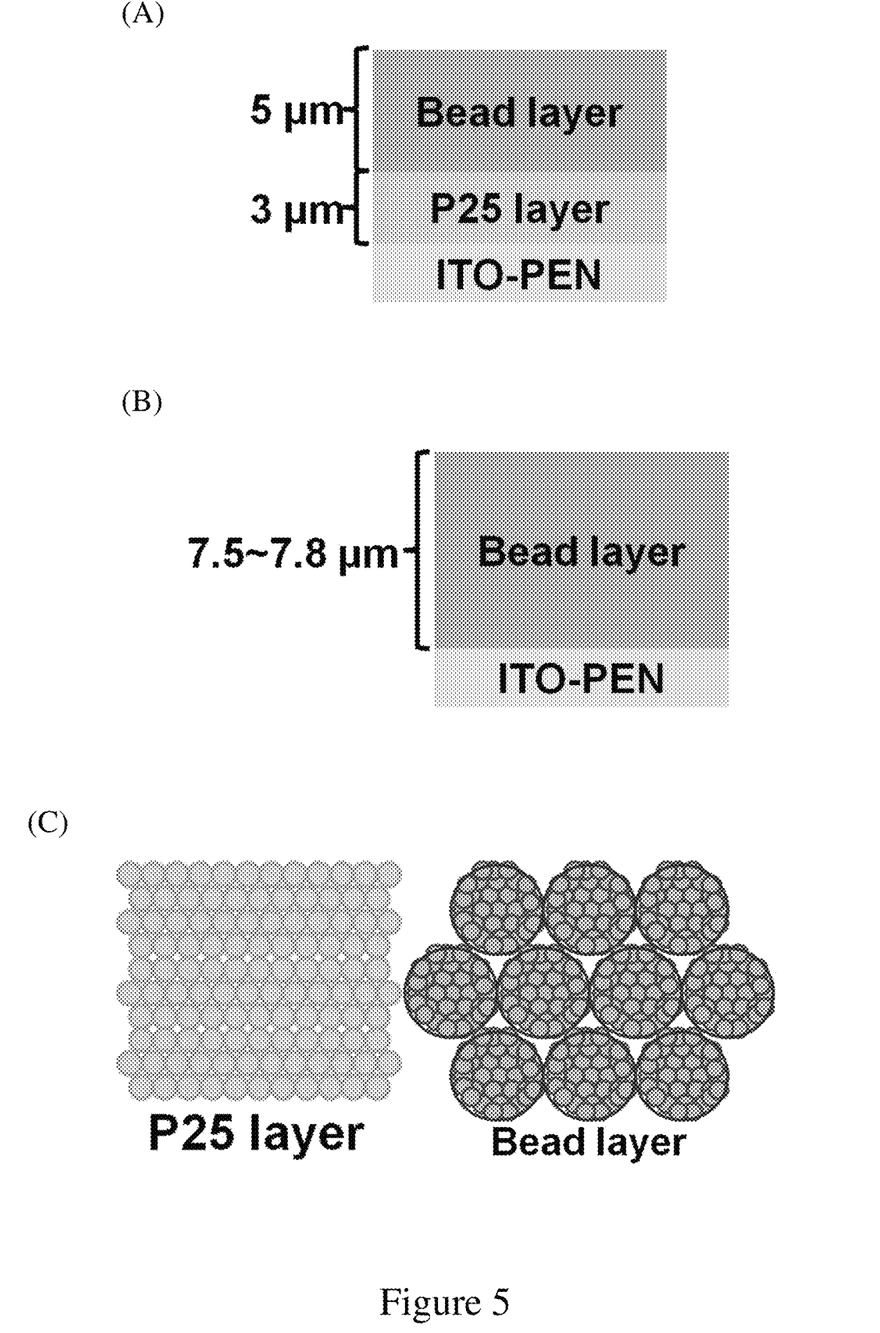
In FIG. 5, (A) shows the schematic illustration of photoelectrode comprising a scattering layer and a titania nanoparticle layer; (B) shows the schematic illustration of photoelectrode comprising single titania layer; and (C) shows the amplified schematic illustration of photoelectrode composed of the commercial titania P25 and the comprising titania beads of the present invention.

Preparation of Dye-Sensitized Solar Cells with an Electrode Manufactured by Using the Titania Product of the Present Invention and P25 Powder and Efficiency Analysis Thereof The dye-sensitized solar cells comprising a photoelectrode shown in Table 6 were manufactured as foresaid. The structure of these photoelectrodes is shown in FIG. 5, (A), which is a well-known structure of dye-sensitized solar cells, comprising two layers made of titania, wherein the first one is scattering layer (bead layer) and the second one is a titania nanoparticle layer (P25 layer). In Table 6, photoelectrode A merely comprised a titania nanoparticle layer composed of pure P25, no scattering layer was comprised. Photoelectrode B comprised a titania nanoparticle layer composed of pure P25 and a scattering layer composed by pure P25, so it was substantively equal to a pure P25 nanoparticle layer of 8 μm. In photoelectrode C-G, the second layer was composed of the titania products of the present invention, in which the second layer of photoelectrodes C-F was prepared by coating the titania bead of the present invention on photoelectrode A, and the second layer of photoelectrode G was prepared by H 0.25 200 which was not in form of bead, but in form of nanoparticle (irregular shape under SEM observation). The labels of the titania products of the present invention are as foresaid described.

The cell efficiency (η) of the above-mentioned dye-sensitized solar cells was measured by the standard method for measuring dye-sensitized solar cell efficiency, in which solar simulator was used with parameter set at AM 1.5 G to mimic the cell expression under true sun light. In addition, a power supply was used to provide an applied voltage to the dye-sensitized solar cell of the present invention in order to detect the resulted photocurrent. The applied voltage was changed to mimic the expression of cell under load, thereby calculating the cell efficiency (η), as shown in Table 6.

Furthermore, the dye-loaded photoelectrodes were soaked in an alkali solution (such like 0.1M NaOH in ethanol) for about 1 hour to deabsorb the dye, and the resulted solution was objected to analysis by UV-vis spectrometer for calculating the dye loading. The results are shown in Table 6.

TABLE 6

Result of titania layers of photoelectrode prepared by using P25 powder alone or using the titania product of the present invention and P25 powder

| Sample | 1$^{st}$ layer (3 μm) | 2$^{nd}$ layer (5 μm) | Bead size (nm) | Dye loading (×10$^{-7}$ mol/cm$^{2)}$ | Cell efficiency η (%) |
|---|---|---|---|---|---|
| A | P25 | — | — | 0.87 | 3.21 |
| B | P25 | P25 | — | 2.37 | 4.29 |
| C | P25 | H 0.75 120 | 375 | 4.85 | 4.57 |
| D | P25 | H 0.75 160 | 750 | 4.64 | 5.01 |
| E | P25 | H 0.75 200 | 500 | 4.52 | 5.48 |
| F | P25 | H 0.50 200 | 250 | 4.48 | 4.84 |
| G | P25 | H 0.25 200 | NPs | 4.32 | 4.55 |

NPs: nanoparticles (not beads)

In Cells A-G, as shown in Table 6, it is found that Cell A has the lowest efficiency (3.21%), and Cell E has the highest efficiency (5.5%). The main difference between Cells A and B is the thickness of photoelectrode, so the dye loading is obviously different—Cell B has a greater dye loading, which is able to produce more electrons and results in a better efficiency (4.29%). The two-layer structures of Cells B-G have the same thickness of photoelectrode, but Cells C-G with a second layer made by the titania product of the present invention have a higher efficiency than Cell B with a second layer made by P25 only. Particularly, the cell efficiency of Cell E is higher than higher than Cell B by nearly 30%, and it is 1.7 times of Cell A. These data show that the scattering layer of photoelectrode prepared by the mesoporous titania beads of the present invention dramatically increases the cell efficiency.

Furthermore, the dye-loading of Cells C-G is about twice of Cell B (data not shown), and this is related to the higher specific surface area and pore volume of the titania products of the present invention. Greater dye-loading means the cell is capable of absorbing more light to produce more electrons. In FIG. 5, (C) is the amplified schematic illustration of the P25 layer and the titania layer of the present invention in Cells C-G. When the particles/beads are normally piled up, the space between the titania beads of the present invention is greater, which is easy to accommodate dye or electrolyte, but the titania nanoparticles comprised in the beads are contact and orientedly attached. The photoelectrode using the mesoporous titania bead of the present invention has about twice dye loading than that made of ST 41 that is generally used for the scattering layer of photoelectrode (data not shown).

Cells C-G using the titania beads of the present invention does not have an apparent difference in dye loading, but they do have an obvious difference in cell efficiency: the lowest is Cell G (4.55%), and the highest is Cell E (5.48%). It shows that different amount of steric agent and different temperature of water-heating treatment give the titania products different crystallinity, bead size and surface oxygen vacancy concentration in the present invention, and all these characteristics affect cell efficiency.

This example provides a two-layer titania structure prepared by the mesoporous titania beads of the present invention and commercial titania nanopowder P25 (i.e., bead layer and nanoparticle layer), and the titania nanoparticle layer can be prepared by any nano-scale titania powder.

Example 3

Preparation of Dye-Sensitized Solar Cells with an Electrode Manufactured by Using the Titania Product of the Present Invention Alone and Efficiency Analysis Thereof The dye-sensitized solar cells comprising a photoelectrode shown in Table 7 were manufactured as foresaid, wherein the structure of these photoelectrodes is shown in FIG. 5, (B). Photoelectrode O was composed of the nanoparticle H 0.25 200, which was not in form of bead. Photoelectrodes H-N were prepared by using the mesoporous titania bead of the present invention alone. Sample B was the control. The labels of the titania products of the present invention are as foresaid described.

TABLE 7

Result of titania layers of photoelectrode prepared by using the titania product of the present invention alone

| Sample | Photoelectrode | thickness (μm) | Bead size (nm) | Dye loading (×10$^{-7}$ mol/cm$^{2)}$ | Cell efficiency η (%) |
|---|---|---|---|---|---|
| B | P25 | 8 | — | 2.37 | 4.29 |
| H | H 0.75 120 | 7.5 | 375 | 5.60 | 3.16 |
| I | H 0.75 160 | 2.7 | 750 | 1.90 | 2.63 |
| J | H 0.75 160 | 5.2 | 750 | 3.64 | 3.69 |
| K | H 0.75 160 | 7.8 | 750 | 5.48 | 4.03 |
| L | H 0.75 160 | 10.0 | 750 | 6.84 | 3.53 |
| M | H 0.75 200 | 7.6 | 500 | 5.28 | 4.92 |
| N | H 0.50 200 | 7.8 | 250 | 5.12 | 4.74 |
| O | H 0.25 200 | 7.8 | NPs | 4.96 | 4.56 |

NPs: nanoparticles (not beads)

In Cells I, J, K and L, which uses the same bead (H 0.75 160 with bead size of 750 nm) with different thickness of titania layer, the best cell efficiency does not go to Cell L having the thickest titania layer, but to Cell K having a thickness of 7.8 μm; and the cell efficiency of Cell K is close to Cell B having a photoelectrode prepared by pure P25 with an equal thickness (8 μm). Regarding with Cells H-O prepared by the titania product of the present invention alone, the lowest cell efficiency goes to Cell H (3.16%), and the highest goes to Cell M (4.92%); and the cell efficiency of Cell M is higher than Cell B of pure P25 by nearly 15%. In addition, the dye loading of the mesoporous titania beads of the present invention can be 2-3 times of P25 (Cell B).

In the flexible cell applications, the best thickness of titania layer is generally not over 10 μm. Thus, it is obvious that the mesoporous titania beads of the present invention can be applied to the flexible cells, especially to dye-sensitized solar cells.

Example 4

Preparation of Dye-Sensitized Solar Cells with an Electrode Manufactured by Using the Mixture of the Titania Product of the Present Invention and P25 Powder and Efficiency Analysis Thereof The dye-sensitized solar cells comprising a photoelectrode shown in Table 8 were manufactured as foresaid, wherein the structure of these photoelectrodes is shown in FIG. 5, (B). Photoelectrodes Q-S were prepared by the mixture of H 0.75 160 and P25 at a specific ratio into a layer with a specific thickness. Photoelectrodes T-V were prepared by the mixture of one of the H 200 series and P25 at a specific ratio into a layer with a specific thickness. Samples B and K were controls. The labels of the titania products of the present invention are as foresaid described.

TABLE 8

Result of titania layers of photoelectrode prepared by using the mixture of titania product of the present invention and P25

| Sample | P25 (wt %) | TiO$_2$ bead of the present invention (wt %) | thickness (μm) | Final bead size (nm) | Dye loading ($\times 10^{-7}$ mol/cm$^2$) | Cell efficiency η (%) |
|---|---|---|---|---|---|---|
| B | 100 | — | 8.0 | — | 2.37 | 4.29 |
| K | — | 100 (H 0.75 160) | 7.8 | 750 | 5.48 | 4.03 |
| P | 75 | 25 (H 0.75 120) | 7.5 | 375 | 3.08 | 2.97 |
| Q | 25 | 75 (H 0.75 160) | 7.0 | 750 | 4.50 | 1.88 |
| R | 50 | 50 (H 0.75 160) | 7.4 | 750 | 3.73 | 2.62 |
| S | 75 | 25 (H 0.75 160) | 7.7 | 750 | 2.95 | 3.01 |
| T | 75 | 25 (H 0.75 200) | 7.6 | 500 | 2.84 | 3.21 |
| U | 75 | 25 (H 0.50 200) | 7.5 | 250 | 2.72 | 3.00 |
| V | 75 | 25 (H 0.25 200) | 7.5 | NPs | 2.63 | 3.25 |

NPs: nanoparticles (not beads)

In the preparation of Cells Q-S, the beads of H 0.75 160 (with bead size of 750 nm) were mixed with P25 with a specific proportion of 75%, 50% and 25%, respectively. Comparing with Cell K using pure H 0.75 160 as the photoelectrode, Cells Q-S have a dramatically reduced cell efficiency. This shows that the mixtures of the mesoporous titania bead of the present invention and P25giave a cell efficiency lower than pure bead, and Cell 5 having a lower bead content (25%) provides a relatively high cell efficiency (3.01%). The dye loading increases when the bead content increases (data not shown), which demonstrates that P25 does not fill in the space between beads. However, the other mixture of a variety of titania products of the present invention and P25 have similar cell efficiency according to data shown in Table 8, which means the interface between P25 and the titania products of the present invention consumes electrons, and eliminates the difference between these materials.

In summary, these examples clearly elucidate that the present invention provides a two-step method for preparing a mesoporous titania bead, and the mesoporous titania bead prepared by the method. Said mesoporous titania bead increases cell efficiency. When the thickness of the photoelectrode is 8 μm, the titania nanoparticle layer made by pure P25 increases cell efficiency by 4.3%; the combination with a mesoporous titania bead layer of the present invention increases cell efficiency by 5.5%, which is about 30% higher; and the titania layer made by the mesoporous titania bead of the present invention alone increases cell efficiency by 5%, which is about 20% higher. From above, it should be clear that a photoelectrode with higher crystallinity and lower surface oxygen vacancy concentration helps electron diffusion and reduces the recombination, thereby increasing electron collection efficiency dramatically. In addition, although larger bead provides higher light harvesting efficiency, but it also causes more back-scattering, and the electron injection efficiency reduces because the extra dye stays in the space between beads; however, the increase of light harvesting is greater than the reduce of electron injection efficiency, as well as the fast electron diffusion resulted from anatase titania and the oriented attachment, the cell efficiency is still higher than the traditional technology. From the data of the present invention, the best titania bead for photoelectrode has a bead size of 500 nm with high crystallinity and low surface oxygen vacancy concentration because it results in more back-scattering and good dye-loading.

We claim:
1. A method for preparing a photoelectrode, consisting of:
   (1) preparing a mesoporous titania bead by:
       (i) adding a steric agent and a titanium-containing precursor to ethanol for sol-gel reaction to form a sol-gel product, wherein the molar ratio of said steric agent : said titanium-containing precursor: ethanol is 0.1-1:1: 200-300, and the steric agent is a tertiary amine; and
       (ii) heating said sol-gel product in water at 120-200° C. for 1-24 hours to obtain the mesoporous titania bead;
   (2) providing a transparent non-conductive plastic substrate covered by a transparent conductive film;
   (3) coating the mesoporous titania bead on said non-conductive plastic substrate to obtain a coated layer, in which the titania comprised in the bead is anatase titania; and
   (4) pressing the coated layer from step (3) under room temperature to obtain said photoelectrode; and
   optionally, between step (2) and step (3), coating a titania nanoparticle on said transparent non-conductive plastic substrate to obtain a titania nanoparticle layer, and said titania nanoparticle is not said mesoporous titania bead.
2. The method according to claim 1, wherein said transparent conductive film is a ITO, FTO or TCO film.
3. The method according to claim 1, wherein said transparent non-conductive plastic substrate is PEN or PET substrate.
4. The method according to claim 1, wherein said coated layer has a thickness of 5-10 μm.
5. The method according to claim 1, wherein said titania nanoparticle layer has a thickness of 3-5 μm.
6. The method according to claim 1, which is applied to manufacture a photoelectrode of a dye-sensitized solar cell.
7. The method according to claim 1, wherein said pressing step is performed under 50 kg/cm$^2$.
8. The method according to claim 1, wherein said mesoporous titania bead has a diameter of 200-1000 nm, specific surface area of 50-100 m²/g, porosity of 40-60%, pore radius of 5-20 nm, pore volume of 0.20-0.30 cm$_3$/g.

\* \* \* \* \*